US006300203B1

(12) United States Patent
Buynoski et al.

(10) Patent No.: US 6,300,203 B1
(45) Date of Patent: Oct. 9, 2001

(54) ELECTROLYTIC DEPOSITION OF DIELECTRIC PRECURSOR MATERIALS FOR USE IN IN-LAID GATE MOS TRANSISTORS

(75) Inventors: Matthew S. Buynoski, Palo Alto, CA (US); Paul R. Besser, Austin, TX (US); Qi Xang, San Jose, CA (US); Paul L. King, Mountain View, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/679,872

(22) Filed: Oct. 5, 2000

(51) Int. Cl.[7] .................................................. H01L 21/336
(52) U.S. Cl. ............................................................ 438/287
(58) Field of Search .................................... 438/287, 291, 438/785

(56) References Cited

U.S. PATENT DOCUMENTS

| 4,235,692 | | 11/1980 | Townsend . | |
| 4,745,082 | | 5/1988 | Kwok . | |
| 5,134,451 | * | 7/1992 | Katoh | 357/23.15 |
| 5,447,874 | | 9/1995 | Grivna et al. . | |
| 5,462,647 | * | 10/1995 | Bhattacharya et al. | 205/74 |
| 5,946,551 | * | 8/1999 | Dimitrakopoulas | 438/99 |
| 5,960,270 | * | 9/1999 | Misra et al. | 438/197 |
| 6,020,243 | * | 2/2000 | Wallace et al. | 438/287 |
| 6,033,963 | | 3/2000 | Huang et al. . | |

\* cited by examiner

*Primary Examiner*—Richard Booth
*Assistant Examiner*—Angel Roman

(57) ABSTRACT

High quality dielectric layers, e.g., high-k dielectric layers comprised of at least one refractory or lanthanum series transition metal oxide or silicate, for use as gate insulator layers in in-laid metal gate MOS transistors and CMOS devices, are formed by electrolytically plating a metal or metal-based dielectric precursor layer comprising at least one refractory or lanthanum series transition metal, on a semiconductor substrate, typically a silicon-based substrate, and then reacting the precursor layer with oxygen or with oxygen and the semiconductor substrate to form the at least one refractory or lanthanum series transition metal oxide or silicate. The inventive methodology prevents, or at least substantially reduces, oxygen access to the substrate surface during at least the initial stage(s) of formation of the gate insulator layer, thereby minimizing deleterious formation of oxygen-induced surface states at the semiconductor substrate/gate insulator interface.

17 Claims, 5 Drawing Sheets

ELECTROLYTIC DEPOSITION OF DIELECTRIC PRECURSOR MATERIALS FOR USE IN IN-LAID GATE MOS TRANSISTORS

CROSS-REFERENCE TO RELATED APPLICATION

This application contains subject matter similar to subject matter disclosed in co-pending U.S. patent application Ser. Nos. 09/679,881, filed on Oct. 5, 2000 and 09/679,369, filed on Oct. 5, 2000.

FIELD OF THE INVENTION

The present invention relates to methods of manufacturing a semiconductor device, e.g., an MOS transistor device, wherein the source, drain, channel regions, and the gate electrode of the transistor are formed in a self-aligned manner utilizing an in-laid ("damascene") gate and corresponding processing techniques therefor. The present invention has particular utility in the manufacture of high integration density semiconductor devices employing design rules of 0.20 μm and below, e.g., 0.15 μm and below.

BACKGROUND OF THE INVENTION AND RELATED ART

The escalating requirements for high density and performance (e.g., transistor and circuit speeds) associated with ultra-large scale integration ("ULSI") devices necessitate design rules for component features of 0.20 μm and below, such as 0.15 μm and below, such as source, drain, and gate regions and electrodes therefor formed in or on a common semiconductor substrate, challenges the limitations of conventional materials and manufacturing processes and necessitates use of alternative materials and development of new methodologies therefor.

An example of the above-mentioned challenge based upon the limitations inherent in conventional materials and methodologies utilized in the semiconductor integrated circuit ("IC") industry is the use of polysilicon for forming gate electrodes of metal-oxide-semiconductor ("MOS") transistors. Polysilicon is conventionally employed as a gate electrode material in MOS transistors in view of its good thermal stability, i.e., ability to withstand high temperature processing. More specifically, the good thermal stability of polysilicon-based materials permits high temperature annealing thereof during formation/activation of implanted source and drain regions. In addition, polysilicon-based materials advantageously block implantation of dopant ions into the underlying channel region of the transistor, thereby facilitating formation of self-aligned source and drain regions after gate electrode deposition/patterning is completed.

However, polysilicon-based gate electrodes incur a number of disadvantages, including, inter alia: (1) as device design rules decrease to below about 0.20 μm, polysilicon gates are adversely affected by poly depletion, wherein the effective gate oxide thickness ("EOT") is increased. Such increase in EOT can reduce performance by about 15% or more; (2) polysilicon-based gate electrodes have higher resistivities than most metal or metallic materials and thus devices including polysilicon as electrode or circuit materials operate at a much slower speed than equivalent devices utilizing metalbased materials. Further, a significant portion of the voltage applied to the gate during operation is dropped in the polysilicon due to the poor conductivity of silicon. As a consequence, in order to compensate for the higher resistance, polysilicon-based materials require silicide processing in order to decrease their resistance and thus increase the operational speeds of polysilicon-based devices to acceptable levels; (3) use of polysilicon-based gates necessitates ion implantation of different dopant atoms for p-channel transistors and n-channel transistors formed in a CMOS device, which different dopant species are required for the p-channel and n-channel transistors to have compatible threshold voltages ("$V_t$"). Disadvantageously, the threshold adjust implant is of sufficiently high doping concentration as to adversely impact the mobility of charge carriers in and through the channel region; and (4) polysilicon-based gate electrodes are less compatible with high dielectric constant ("high-k") materials (i.e., >5, preferably >20) which are desirable for use as gate oxide layers, vis-a-vis metalbased gate electrodes.

In view of the above-described drawbacks and disadvantages associated with the use of polysilicon-based materials as gate electrodes in MOS and CMOS transistor devices, several process schemes for making self-aligned MOS and/or CMOS transistor devices utilizing in-laid ("damascene") metal or metal-based gate electrodes have been proposed, such as are described in U.S. Pat. No. 4,745,082 (Kwok et al.); U.S. Pat. No. 5,447,874 (Grivna et al.); U.S. Pat. No. 5,960,270 (Misra et al.); and U.S. Pat. No. 6,033,963 (Huang et al.).

Metal or metal-based gate electrode materials offer a number of advantages vis-a-vis conventional polysilicon-based materials, including: (1) since many metal materials are mid-gap work function materials, the same metal gate material can function as a gate electrode for both n-channel and p-channel transistors in a CMOS process without adversely requiring threshold voltage ($V_t$) adjust implants while maintaining $V_t$ at compatible levels; (2) metal gates allow the charge carrier mobility of the channel region to be improved since the channel region will no longer need high dose threshold implants and higher doping profiles in the MOS channel region; (3) metal gate electrodes have a greater conductivity than polysilicon electrodes and do not require complicated silicide processing in order to perform at high operational speeds; (4) unlike polysilicon-based gate electrodes, metal gate electrodes do not suffer from polysilicon depletion which affects the EOT of an MOS transistor, thereby affecting the performance of the MOS device (i.e., thinner EOTs, while possibly resulting in an increased leakage current, result in faster operating devices); (5) metal gate MOS devices are advantageous for use in fully-depleted silicon-on-insulator ("SOI") devices since $V_t$ of these devices can be more accurately controlled; and (6) metal gate electrodes are more compatible with high-k dielectrics than conventional polysilicon processing.

The use of metal or metallic materials as replacements for polysilicon-based materials as gate electrodes in MOS and/or CMOS devices incurs several difficulties, however, which difficulties must be considered and overcome in any metal-based gate electrode process scheme, including: (1) metal and/or metal-based gates cannot withstand the higher temperatures and oxidative ambients which conventional polysilicon-based gate electrode materials can withstand; (2) several candidate metals or metallic materials for use as gate electrodes do not exhibit adequate adhesion in film form to surrounding layers of different materials when these metals or metallic materials are patterned to very small geometries; (3) some metal or metallic films are difficult to lithographically pattern and etch via conventional processing techniques because etching thereof may significantly damage underlying oxides, thereby adversely affecting device performance; and (4) thermal processing subsequent to metal gate electrode formation may result in instability and degradation of the gate oxide due to chemical interaction between the metal and oxide at the metal gate-gate oxide interface.

An example of a suitable process sequence for forming an in-laid (or damascene) gate electrode is disclosed in U.S. Pat. No. 5,960,270, which process overcomes the above-enumerated difficulties associated with the use of metal or metal-based materials as gate electrodes in MOS and/or CMOS transistor devices, and is described below with reference to FIGS. 1–7. Briefly stated, according to this process, an in-laid, metal-gated MOS transistor is fabricated which comprises selfaligned source and drain electrodes which are formed before the in-laid metal gate electrode is formed. An opening is formed in a dielectric layer overlying a semiconductor substrate to define locations for source and drain regions, which source and drain regions are formed by thermally out-diffusing dopant atoms from overlying metal silicide regions, which metal silicide regions have been formed into source and drain segments in a self-aligned manner by formation of the opening in the dielectric layer. As a consequence, the source and drain regions are formed self-aligned to the opening in the dielectric layer, and the latter then subsequently filled with the metal or metal-based gate electrode material (after gate oxide formation by thermal oxidation of the substrate surface exposed through the opening). Since, according to this process scheme, doping of the source and drain regions is thermally driven and the source and drain regions are thermally activated before formation of the in-laid metal-based gate electrode, subjection of the latter to adverse thermal processing can be avoided.

Referring now to FIG. 1, a first process for fabricating an MOS transistor device 10 comprises providing a semiconductor substrate 12, typically a silicon (Si) wafer, in which trench-like dielectric 5 field isolation regions 14 are formed, as by conventional techniques, e.g., local oxidation of silicon ("LOCOS"), followed by formation of a p-type or n-type well region 16 in the substrate region intermediate adjacent field oxide regions 14. It should be recognized that, while in the figure, only one (1) well region is illustrated, a plurality of well regions of different conductivity type may be formed in the substrate for fabrication of, e.g., a CMOS device. In any event, after formation of the well region 16, an about 300–400 Å thick silicide layer 18, preferably of either cobalt silicide (CoSi$_2$) or nickel silicide (NiSi) is selectively formed overlying the well region 16, as by a selective growth process. The silicide layer 18 is doped with an appropriate conductivity type dopant, depending upon whether an NMOS or PMOS transistor is to be formed, either by ion implantation subsequent to its deposition or by in situ doping during deposition.

Referring now to FIG. 2, a thin (i.e., about 500 Å thick) plasma-enhanced chemical vapor deposited ("PECVD") nitride layer 20 (utilized as an etch stop layer in subsequent processing) is then deposited so as to overlie the trench isolation regions 14 and the silicide layer 18. An about 1,000–4,000 Å thick (~2,000 Å being preferred), low temperature dielectric oxide layer 22, e.g., of tetraethylorthosilicate ("TEOS") is then blanket-deposited over nitride layer 20.

Adverting to FIG. 3, an opening 24 is then formed in the oxide layer 22 overlying a central portion of well region 16, as by conventional photolithographic masking and etching techniques including plasma etching, the opening 24 extending through the nitride 20 and silicide 18 layers to expose at the bottom thereof a portion of the surface of semiconductor substrate 12. The opening 24 segments the silicide layer 18 into two separated portions, each of which is utilized for forming a respective underlying source or drain region of an MOS transistor in a following processing step.

Referring to FIG. 4, a thermal out-diffusion process is then performed for driving the dopant species out of the two silicide regions 18 to form respective underlying, fully self-aligned source and drain regions 26 and 28 within the substrate 12, the dopant species diffusing both vertically and laterally within the semiconductor substrate material. The doped silicide regions 18 remain in place for use as a portion of the source and drain electrodes, whereby the conductivity of these electrodes is enhanced.

As next illustrated in FIG. 5, an about 100 Å thick layer 25 of a sacrificial oxide, e.g., a silicon oxide, is formed, as by thermal oxidation, on the surface of the semiconductor substrate 12 exposed at the bottom of opening 24, and sidewall spacers 23, typically of a silicon nitride (Si$_x$N$_y$), are formed on the internal wall surface of the opening 24, e.g., by conventional technigues. A threshold voltage (V$_t$) adjust implant is then performed at a low ion implant energy to form V$_t$ adjust doped (i.e., implanted) region 31 within the portion of the well region 16 exposed through opening 24, after which the exposed portion of the sacrificial oxide layer 25 (i.e., the portion not covered by the sidewall spacers 23) is removed, as by etching. The spacers 23 provide, a necessary offset for not only compensating for lateral diffusion of the source and drain regions 26 and 28 but also for electrical isolation of subsequent gate electrode formations from the silicide regions 18, whereby Miller effects are reduced.

With reference to FIG. 6, a thermal oxidation of the exposed portion of the well region 18 is performed to form a thermal gate oxide layer 27 (or a high-k dielectric layer), and a metal or metal-containing electrically conductive material (e.g., comprising one or more of molybdenum (Mo), tungsten (W), titanium (Ti), aluminum (Al), tungsten silicide (WSi$_2$), nickel silicide (NiSi), titanium nitride (TiN), and composites thereof, preferably selected on the basis of having a mid-gap work function so that the V$_t$ of both p-type and n-type transistors formed on the same substrate 12 are compatible) is deposited, via a suitable deposition process, to form a sufficiently thick blanket layer 28a filling the opening 24 and extending over the upper surface of dielectric layer 22.

Referring now to FIG. 7, the in-laid gate electrode process is completed by performing a planarization step, typically chemical-mechanical-polishing ("CMP"), for removing the portions of blanket layer 28a extending over the dielectric layer and for rendering the upper surface of the remaining electrically conductive plug 28b (constituting the gate electrode) co-planar with the upper, exposed surface of dielectric layer 22. Electrical contacts to the source and drain regions 26 and 28 may then be formed, as by conventional photolithographic masking and etching to form openings in dielectric layer 22 extending to the respective silicide layers 18, which openings are then filled with an electrically conductive material, e.g., a metal.

Another example of a suitable process sequence disclosed in U.S. Pat. No. 5,960,270 for forming an in-laid gate electrode for use in MOS and/or CMOS devices is described below with reference to FIGS. 8–16. Briefly stated, according to this process, a polysilicon or amorphous silicon ("a-Si") "dummy" or temporary gate electrode is formed and utilized as a mask for implanting self-aligned source and drain regions in the substrate. After formation of the source/drain regions, a dielectric layer is blanket-deposited and planarized (as by CMP) to expose a top portion of the dummy/temporary polysilicon or a-Si gate electrode. The polysilicon or a-Si dummy/temporary gate electrode is then removed to form a void where it was once located, which void is then filled with a metal gate electrode material, the latter being aligned to the source/drain regions by virtue of being formed in a location previously occupied by the self-aligned polysilicon or a-Si dummy/temporary gate.

Referring to FIG. 8, an initial step in the manufacture of semiconductor device 100 comprises formation of trench isolation regions 104 of a dielectric material in a suitable semiconductor substrate 102 (as in FIG. 1 of the first process), along with doped well regions 103 (i.e., at least one n-type well region and at least one p-type well region) for enabling CMOS device formation. A sacrificial thermal gate oxide layer 105 is formed over the upper surface of substrate 102 and then removed in order to yield a clean, active upper surface within the well region(s) 103.

Adverting to FIG. 9, a gate oxide layer 106 is formed on the exposed surface of well region 103, followed by sequential deposition thereon of a polysilicon dummy/temporary gate electrode 108 and an antireflective coating ("ARC") layer 110. The thus-obtained multi-layer structure is then subjected to photolithographic patterning/etching to form a dummy gate electrode stack.

With reference to FIG. 10, a sidewall gate oxidation is then performed to form sidewall oxidation layer 112, followed by formation thereon of tapered sidewall spacers 114, typically of a silicon nitride. Source and drain regions 118 are then formed in a self-aligned manner, as by conventional ion implantation and lightly doped drain ("LDD") processing.

Referring to FIG. 11, a refractory metal layer (e.g., of Co or Ti) is then deposited over the exposed upper surface of the thus-obtained structure and thermally reacted with the exposed silicon (Si) portions of the source and drain regions 118 to form an upper metal silicide layer 116 in contact with a portion of each of the source and drain regions. Silicide layer 116 does not form on the top of the polysilicon dummy gate electrode layer 108 due to the presence of the ARC layer 110.

In a following step, illustrated in FIG. 12, a nitride layer 120 is formed over the upper, exposed surface by a plasma enhanced deposition process, and a blanket-deposited dielectric layer 122 (e.g., a TEOS layer) deposited thereover to form an inter-level dielectric layer ("ILD") 120/122. Then, as shown in FIG. 13, a suitable planarization process, e.g., CMP, is performed on the ILD layer utilizing polysilcon layer 108 as a polishing stop, thereby exposing the top surface of polysilicon dummy/temporary gate electrode layer 108.

Referring now to FIG. 14, the polysilicon dummy/temporary gate electrode layer 108 is removed by means of a selective etching process (e.g., reactive ion etching ("RIE") in a chlorine ($Cl_2$) plasma or wet polysilicon etching) to form a feature opening 124. $V_t$ is then optionally adjusted, as needed, by means of ion implantation through the feature opening 124 and the gate oxide layer 106 to form $V_t$ doped region 126. Gate oxide layer 106 is typically a sacrificial oxide layer which is removed and replaced with a high-k gate dielectric layer 125, as by thermal processing.

Adverting to FIG. 15, a metal or metal-based layer, e.g., of W, Mo, Ti, Al, TiN, $WSi_2$, $TiSi_2$, etc., is deposited as to fill the feature opening 124 and form a blanket or overburden layer 128a extending over the upper surfaces of the structure. In a following step, shown in FIG. 16, blanket or overburden layer 128a is planarized, as by CMP, to form a metal plug 128b filling the feature opening 124. Thus, metal gate electrode 128b is of substantially similar dimension and location as the dummy/temporary polysilicon gate electrode 108. As a consequence, the metal gate electrode 128b is self-aligned to the source/drain regions 118 formed within the substrate 102, as was dummy/temporary gate electrode 108.

In either of the above-described variants of in-laid metal gate electrode processing sequences, the ultimately formed gate oxide layer (27 or 125) is preferably comprised of a high-k dielectric material, inasmuch as such high-k dielectric materials advantageously provide greater coupling between the gate electrode and the underlying channel region of MOS transistors. However, the formation (e.g., deposition) and use of such high-k dielectric materials in the in-laid (or damascenetype) structures formed as part of the processing schemes (e.g., as shown in FIGS. 5–6 and 14–15) is difficult and problematic. Specifically, conventional high temperature methods for forming the high-k dielectric materials result in formation of a residue of high-k material on the sidewalls of the feature openings or apertures (24 or 124), which residue increases parasitic capacitance between the gate electrode and the source/drain regions. In addition, many high-k dielectric materials exhibit poor adhesion to Si and Si-based semiconductor substrate materials, as well as poor surface quality when in contact with Si-based materials.

For high-k dielectric materials (e.g., refractory metal oxides or silicates) to be optimally useful in in-laid metal gate MOS and CMOS transistor applications, it is necessary that gate dielectric layers fabricated therefrom have a smooth interface with the underlying semiconductor substrate (e.g., Si or Si-based), with a very low density of surface states. However, all of the methods conventionally employed (or proposed) for forming such high-k dielectric layers utilize chemical vapor deposition ("CVD") or physical vapor deposition ("PVD") processes which incur a number of disadvantages and drawbacks, including: (1) energetic ion bombardment accompanying PVD-type processing resulting in degradation of the oxide/Si interface; (2) presence of free oxygen during PVD- and/or CVD-type processing resulting in unwanted reaction with Si substrate material to form low-k $SiO_2$-based dielectric materials; and (3) entrapment of ion bombarded species during PVD-type processing, along with associated radiation damage of the deposited high-k dielectric films.

Accordingly, there exists a need for improved methodology for performing simple, reliable, and rapid formation of thin layers of dielectric materials (e.g., high-k oxides and/or silicates of refractory metals) for use as gate insulator layers in in-laid gate electrode MOS transistors and/or CMOS devices, which methodology avoids the drawbacks and disadvantages associated with the conventionally utilized CVD- and PVD-based methods and techniques and provides, inter alia, MOS transistors and/or CMOS devices exhibiting reduced parasitic capacitance between the gate and source/drain regions and improved transistor characteristics and properties.

The present invention, wherein a metal-based precursor for the high-k gate dielectric layer is electrolytically-deposited at a relatively low temperature in the absence of bombarding species or free oxygen and subsequently converted into a thin layer of a desired high-k dielectric material in a manner which substantially precludes access of oxygen to the semiconductor substrate/dielectric layer interface, effectively addresses and solves the need for improved methodology for the manufacture of high quality, in-laid gate (e.g., metal gate) MOS transistors and CMOS devices, while utilizing low cost processing techniques and apparatus. Further, the methodology provided by the present invention enjoys diverse utility in the manufacture of numerous and various types of semiconductor devices and/or components requiring high quality dielectric layers for use as gate insulators.

DISCLOSURE OF THE INVENTION

An advantage of the present invention is an improved method for forming an in-laid gate electrode MOS transistor and/or CMOS device.

Another advantage of the present invention is an improved method for forming an in-laid metal gate electrode MOS transistor and/or CMOS device.

Still another advantage of the present invention is an improved method for forming an in-laid gate electrode MOS transistor and/or CMOS device including an improved high-k dielectric gate insulator layer.

Yet another advantage of the present invention is improved in-laid gate electrode MOS transistors and/or CMOS devices.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by a method of forming a semiconductor device comprising at least one MOS transistor, comprising the sequential steps of:

(a) providing a semiconductor substrate including at least a region of a first conductivity type and having a surface;

(b) forming in the region of first conductivity type a pair of spaced-apart source and drain regions of a second, opposite conductivity type, the pair of spaced-apart source and drain regions extending to the substrate surface and including a pair of opposed, facing edges with a space therebetween;

(c) forming a layer of an insulative material extending over the substrate surface;

(d) exposing a portion of the substrate surface including the pair of facing edges of the pair of spaced-apart source and drain regions and the space therebetween;

(e) forming a layer of a gate insulator precursor material on the exposed portion of the substrate surface by electrolytic deposition;

(f) converting the layer of electrolytically-deposited gate insulator precursor material into a layer of gate insulator material; and (g) forming an electrically conductive gate electrode material in contact with the layer of gate insulator material.

According to embodiments of the present invention, step (e) comprises cathodically electroplating a metal layer comprising at least one layer of at least one refractory metal or lanthanum series transition metal selected from the group consisting of Zr, Hf, La, Lu, Eu, Pr, Nd, Gd, Dy, and alloys and mixtures thereof; and step (f) comprises converting the layer of gate insulator precursor material into a layer of a gate insulator material by reaction with oxygen or with oxygen and the material of the underlying semiconductor substrate, typically of silicon or silicon-based.

According to particular embodiments of the present invention, step (f) comprises reacting, e.g., as by electrolytically anodizing, the layer of gate insulator precursor material with oxygen to form a layer of a high-k gate insulator material comprising at least one refractory metal oxide, for example, at least one of zirconium oxide ($ZrO_2$) and hafnium oxide ($HfO_2$), or step (f) comprises reacting, e.g., as by thermal oxidation, the layer of gate insulator precursor material with oxygen and the semiconductor substrate material to form a layer of a high-k gate insulator material comprising at least one refractory metal silicate, for example, at least one of zirconium silicate ($ZrSiO_4$) and hafnium silicate ($HfSiO_4$).

According to further embodiments of the present invention, step (g) comprises forming a blanket layer of an electrically conductive material selected from the group consisting of metals, metal compounds, and semiconductors; and the method further comprises the sequential steps of:

(h) planarizing the blanket layer of electrically conductive material, for example, by performing chemical-mechanical polishing (CMP); and (i) forming electrical contacts to each of the source and drain regions and the gate electrode.

According to other embodiments of the present invention, step (a) comprises providing a semiconductor substrate comprising a material selected from the group consisting of silicon (Si), germanium (Ge), gallium arsenide (GaAs), silicon-germanium (Si–Ge), silicon-on-insulator (SOI), and epitaxial semiconductor layer-on-substrate materials.

According to a first particular embodiment of the present invention, step (a) comprises providing a silicon substrate; and step (b) comprises selectively forming a pair of spaced-apart metal silicide layers on respective spaced-apart portions of the substrate surface, introducing a dopant of second, opposite conductivity type into the pair of spaced-apart metal silicide layers, and forming the pair of spaced-apart source and drain regions by out-diffusion of the dopant of second, opposite conductivity type from the pair of spaced-apart metal silicide layers into the substrate; and step (d) comprises forming an opening extending through the layer of insulative material to form the exposed portion of the substrate surface at the bottom of the opening.

According to a second particular embodiment of the present invention, step (b) comprises forming a temporary gate electrode structure on a portion of the substrate surface, and implanting dopant ions of the second, opposite conductivity type into the substrate surface to form the pair of spaced-apart source and drain regions, the temporary gate electrode forming at least part of an implantation mask during the implanting; step (c) comprises forming a blanket layer of an insulative material extending over the temporary gate electrode structure and the substrate, followed by planarization processing of the blanket layer to remove at least the portion thereof overlying the temporary gate electrode structure; and step (d) comprises removing the temporary gate electrode structure to form the exposed substrate surface portion.

According to another aspect of the present invention, silicon-based MOS transistors or CMOS devices formed according to each of the first and second particular embodiments are provided.

Additional advantages and aspects of the present invention will become apparent to those skilled in the art from the following detailed description, wherein embodiments of the invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that formation of high quality dielectric layers, i.e., illustratively but not limited to, high-k dielectric layers comprised of at least one refractory metal oxide or silicate, for use as gate insulator layers in in-laid gate (e.g., in-laid metal gate) MOS transistors and CMOS devices, can be readily formed by a process which prevents, or at least substantially reduces, access or exposure of the semiconductor (typically of Si but not limited thereto) substrate surface to oxygen at least during the initial stage(s) of the process. A key feature of the present invention is the formation on the semiconductor substrate surface, by relatively low temperature electrolytic deposition, e.g., cathodic electroplating, of a thin layer of metal or metalcontaining dielectric precursor material, e.g., a refractory metal layer such as of zirconium and/or hafnium or a lanthanum series transition metal, which layer of precursor material is subsequently reacted with oxygen to form at least one high-k refractory or lanthanum series transition metal oxide or is reacted with oxygen and the semiconductor substrate material (e.g., Si) to form at least one high-k refractory or lanthanum series transition metal compound oxide, e.g., a refractory metal silicate. As a consequence of the inventive methodology, oxygen access to the semiconductor substrate during at least the initial stage(s) of the gate insulator formation process is prevented or at least substantially reduced, thereby avoiding the disadvantages and drawbacks associated with the conventional processing schemes utilizing CVD, PECVD, and PVD techniques, including, inter alia, deposition of residual high-k material on gate opening sidewalls, poor adhesion with silicon-based substrates, and poor dielectric quality resulting from oxygen-induced surface states at the semiconductor/gate insulator interface. As a further consequence of the inventive methodology, high quality, Si-based, in-laid metal gate electrode MOS transistors and CMOS devices can be reliably and conveniently fabricated in a cost-effective manner utilizing conventional manufacturing apparatus.

Figure 1:
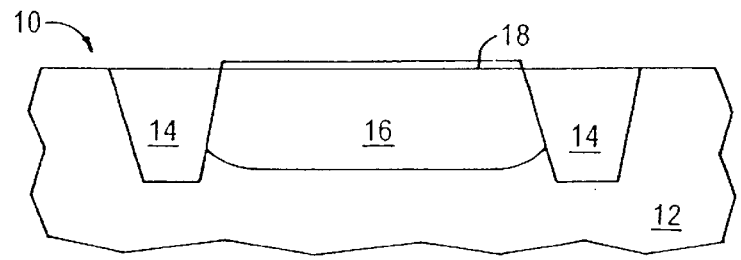
FIGS. 1–7 are schematic, simplified, cross-sectional views illustrating stages in the formation of an in-laid gate electrode MOS transistor according to a first method.
Figure 2:
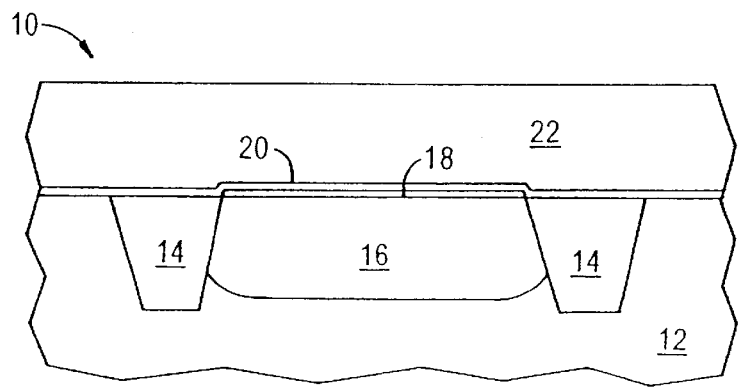
Figure 3:
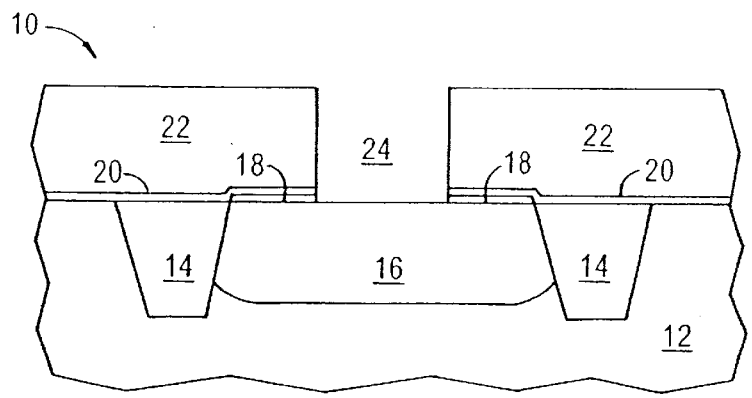
Figure 4:
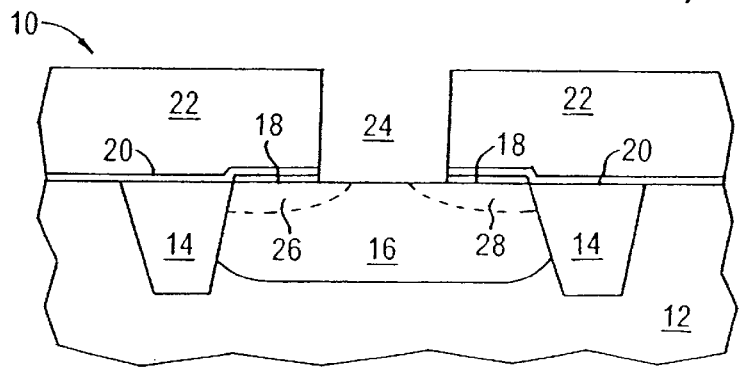
Figure 5:
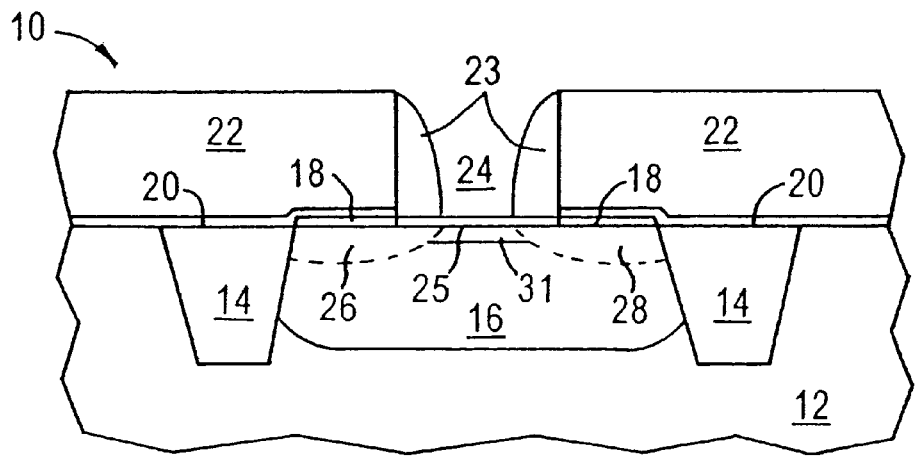
Figure 6:
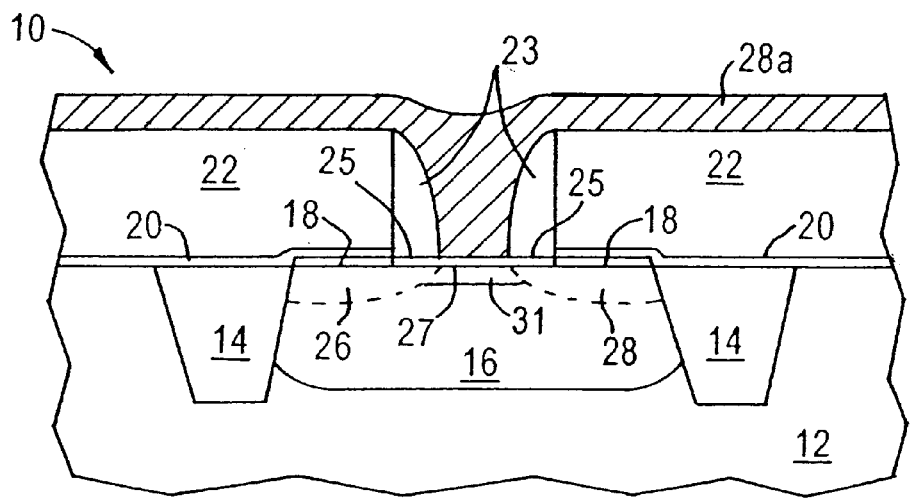
Figure 7:
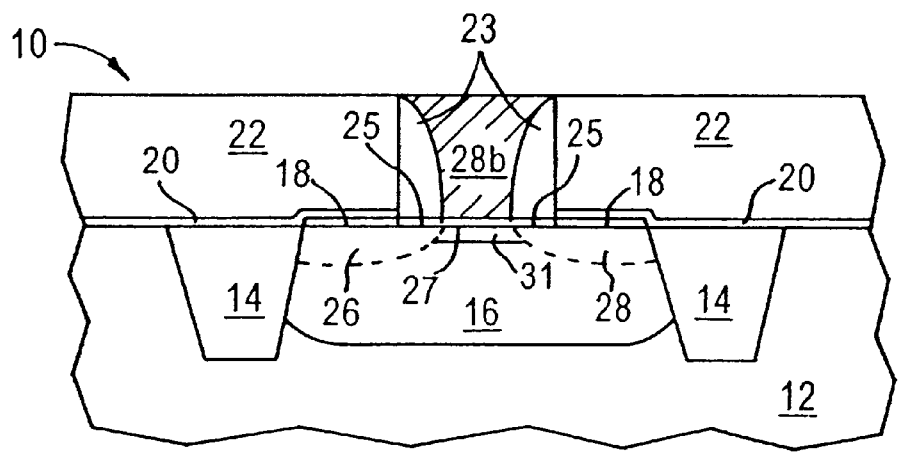
Figure 8:
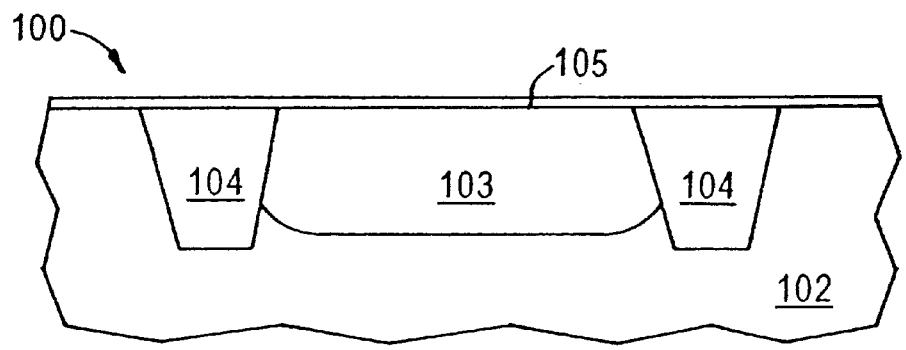
FIGS. 8–16 are schematic, simplified, cross-sectional views illustrating stages in the formation of an in-laid gate electrode MOS transistor according to a second method.
Figure 9:
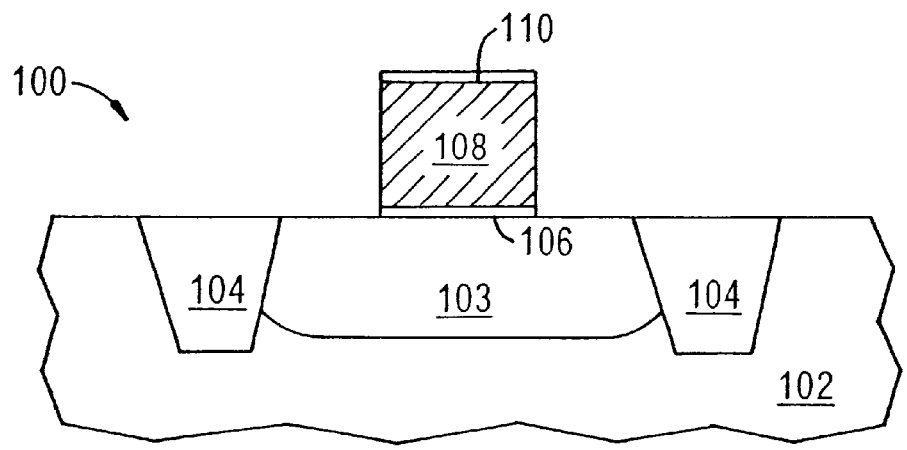
Figure 10:
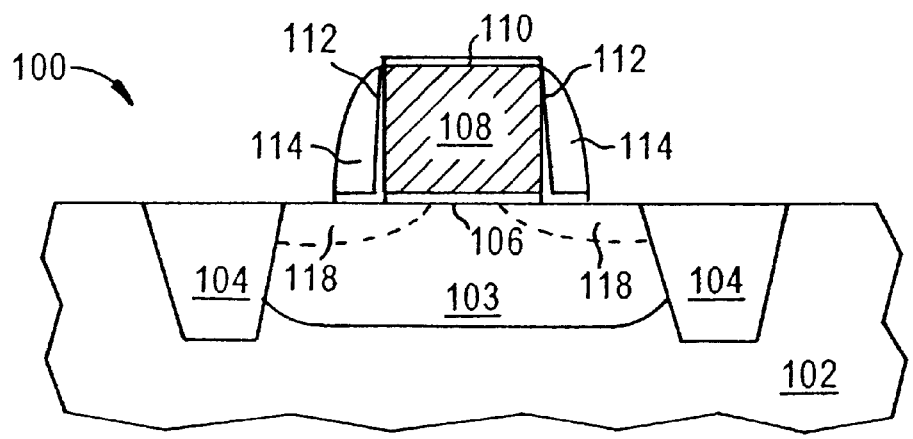
Figure 11:
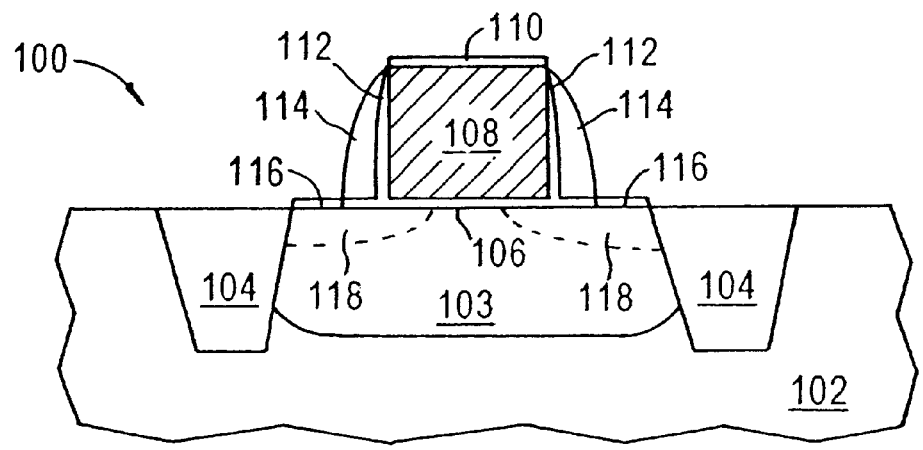
Figure 12:
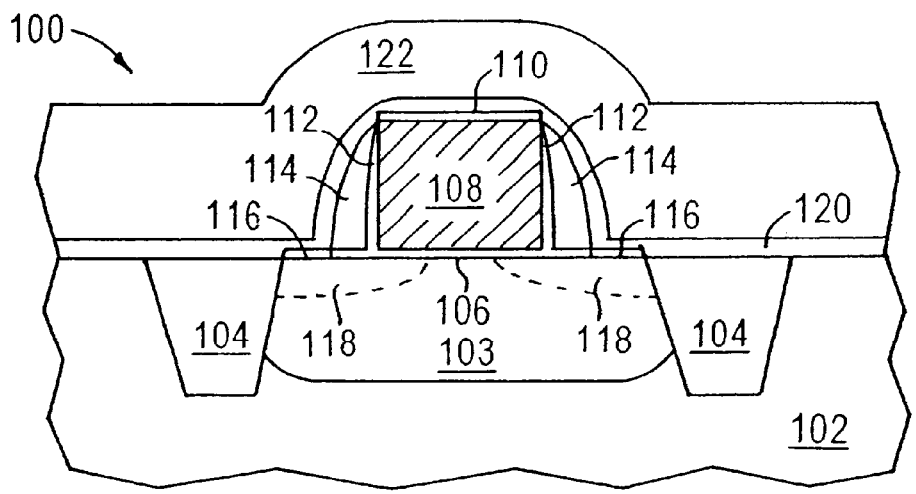
Figure 13:
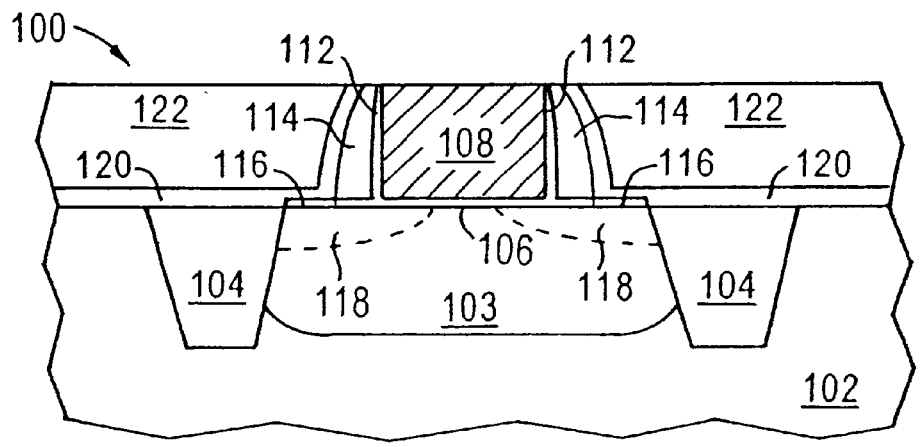
Figure 14:
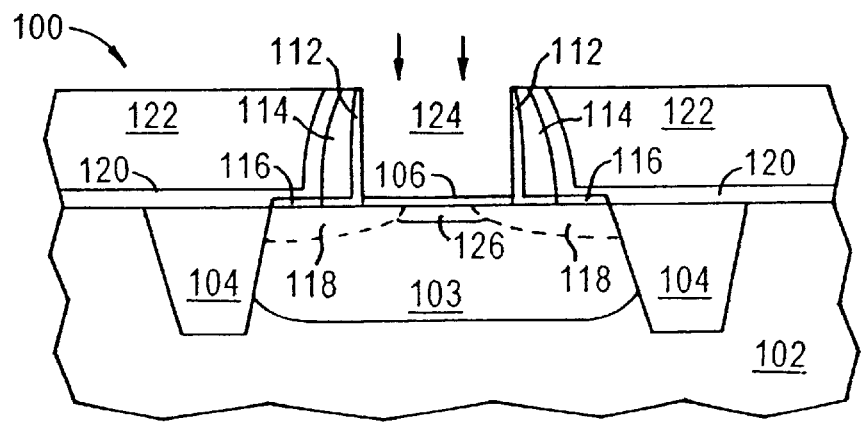
Figure 15:
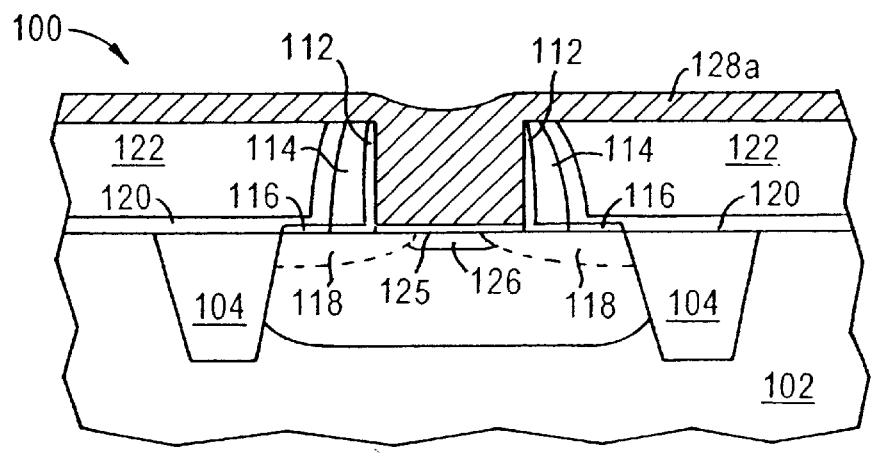
Figure 16:
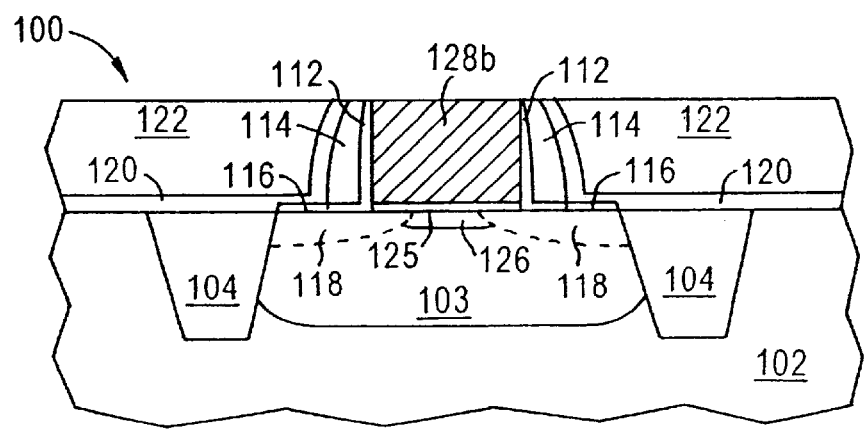

More specifically, reference is again made to FIGS. 1–7 and 8–16 as illustrative of typical process sequences for manufacturing in-laid metal gate MOS transistors and CMOS devices, wherein the gate insulator layers 27 and 125 shown in respective FIGS. 6 and 15 on the surface of semiconductor substrate 12 or 102 exposed at the bottom of respective feature openings 24 and 124 are formed via conventional practices involving thermal oxidation of the Si substrate (as in the case of low-k dielectrics such as $SiO_2$), or by CVD, PECVD, or PVD techniques (as in the case of high-k dielectrics such as refractory metal oxides and silicates). However, according to the present invention, the illustrated conventional process sequences are modified to include a novel two-step sequence for providing the gate insulator layers 27 and 125 which effectively avoids the drawbacks and disadvantages of the conventional art. More specifically, in a first step according to the inventive methodology, a layer of a gate insulator precursor material is initially formed on and in direct contact with the surface of the semiconductor substrate 12 or 102 exposed at the bottom of the feature opening 24 or 124, by means of a relatively low temperature electrolytic deposition process, typically cathodic electroplating, which electroplated precursor layer effectively prevents deleterious access of free oxygen to the precursor/substrate interface, at least prior to subsequent reaction of the precursor layer to form a gate insulator layer. In a second step according to the invention, the electroplated precursor layer is controllably reacted with oxygen or with oxygen and the semiconductor substrate material to form a suitably thick gate insulator layer, preferably a high-k refractory or lanthanum series transition metal oxide or metal silicate layer, reaction of the precursor layer being carefully controlled so as to terminate prior to onset of reaction of the underlying substrate with oxygen to form an unwanted low-k layer, e.g., of $SiO_2$.

According to the invention, the electroplated gate insulator layer is a metal or metal-based layer, preferably comprised of at least one layer of at least one refractory or lanthanum series transition metal which, upon reaction with oxygen (i.e., oxidation) yields a high-k metal oxide, or upon reaction with oxygen and Si-based semiconductor substrate material, yields a high-k metal silicate. Suitable refractory and lanthanum series transition metals for use according to the invention include, but are not limited to: Zr, Hf, La, Lu, Eu, Pr, Nd, Gd, Dy, and alloys and mixtures thereof, with Hf and Zr being preferred in view of their ability to form very high-k oxides ($HfO_2$ and $ZrO_2$) and/or silicates ($HfSiO_4$ and $ZrSiO_4$). The metals may be utilized singly or in combination, e.g., in alloys or mixtures comprised of two or more refractory and/or lanthanum series transition metals. Alternatively, the precursor layer may be in the form of a multiple layer stack comprised of layers different refractory and/or lanthanum series transition metals. The thickness of the precursor layer or layer stack is selected so as to yield a desired thickness gate insulator layer thickness upon complete reaction, e.g., from about 15 to about 200 Å, and typical thicknesses prior to reaction are in the range of from about 5 to about 75 Å. However, inasmuch as the requisite precursor layer thickness for a desired gate insulator thickness depends upon a number of factors, including, inter alia, the particular metal or metals, their consumption ratios upon reaction, type of reaction and type of insulator formed, i.e., oxide or silicate, etc., it is considered that determination of appropriate precursor layer thickness for use in a particular application is within the scope of ordinary skill, given the principles and objectives of the present invention.

Cathodic electroplating of the at least one layer of refractory metal or lanthanum series transition metal or alloy or mixture thereof can be performed, as described in, for example, U.S. Pat. No. 5,462,647, utilizing an electroplating bath (maintained at a temperature of from about 25 to about 75° C.) comprising a solvent mixture of an aprotic solvent (such as dimethylsulfoxide, DMSO) and water containing at least one bath-soluble salt of the at least one metal to be electroplated, e.g., at least one of zirconium nitrate, hafnium nitrate, and lanthanum nitrate, and applying to the semiconductor workpiece immersed therein a constant cathodic potential of from about −3 to about −5 V vs. a silver reference electrode or a repeating pulsed cathodic potential regime comprising application of an about −4 V potential for a first interval, followed by application of an about −1 V potential for a second interval of duration similar to the first interval. Application of either the constant or pulsed cathodic current to the semiconductor workpiece is continued for a sufficient interval to deposit a film of desired thickness determined according to the considerations described supra. In some instances, e.g., with the more reactive refractory or lanthanum series transition metals, the electrodeposition baths may be required to be formulated so as to exclude water. In such instances, the bath solvent may comprise a polar, non-aqueous solvent system, e.g., DMSO, rather than DMSO/$H_2O$, in order to prevent or minimize reaction between the metal ions and the solvent.

The thus-obtained MOS or CMOS intermediate structure with the low temperature, electroplated gate insulator precursor layer structure formed on the substrate surface portion exposed at the bottom of the gate electrode aperture 24 or 124 is then treated (i.e., reacted) such that the precursor layer reacts with at least oxygen to form a metal oxide gate insulator layer of desired thickness or reacts with oxygen and the semiconductor substrate material (silicon-based) to form a metal silicate gate insulator layer of desired thickness. In the former instance, reaction to form a metal oxide is preferably performed by electrolytically oxidizing (i.e., anodizing) the metal precursor layer utilizing a conventional anodization electrolyte (e.g., a glycol/oxalic acid system or other acid-based electrolyte comprising nitric acid, boric acid, acetic acid, citric acid, etc.). In the latter instance, reaction of the metal precursor layer with oxygen and the semiconductor substrate material is preferably accomplished by thermal oxidation in an oxygen-containing atmosphere, for example, at about 400–500° C. for about 10–20 min. However, given the present disclosure and objectives of the invention, suitable electrolytic or thermal oxidation conditions for reaction of the precursor layer for use in a given application can be readily determined by one of ordinary skill in the art.

In either instance, strict control of the extent of reaction of the metal precursor layer is required so that the reaction is terminated before reaction of the typically Si-based substrate occurs to form a disadvantageous low-k $SiO_2$ layer underlying the desired high-k refractory or lanthanum series transition metal oxide or metal silicate gate insulator layer. Suitable control may be achieved by control of the thermal oxidation temperature and time in the case of thermal oxidation reaction for forming metal silicate dielectrics and by control of the anodizing voltage and/or current in the case of electrolytic reaction for forming metal oxide dielectrics, e.g., by use of conventional coulometric measurement/control means.

As a consequence of the inventive methodology, deleterious oxygen access to the substrate surface is advantageously substantially prevented, or at least minimized, to yield higher quality, high-k gate insulator layers than are obtained according to conventional practices. Thus, upon completion of the in-laid gate electrode process by filling of aperture 24 or 124 with a suitable electrically conductive gate electrode material 28b or 128b(e.g., of metal or metal based, or of polysilicon, if desired), and formation of electrical contacts to the source and drain regions and the gate electrode, MOS devices and CMOS transistors formed according to the invention exhibit superior electrical performance and reliability vis-à-vis similar devices fabricated according to conventional methodologies.

The present invention thus enables reliable formation of defect-free, high-quality, high-k gate insulator layers for use in all manner of semiconductor devices, including MOS transistors and CMOS devices. In addition, the inventive methodology enjoys utility in the manufacture of numerous other devices requiring high quality, high-k dielectric layers, e.g., thin-film capacitors. Moreover, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of forming a semiconductor device comprising at least one MOS transistor, comprising the steps of:
    (a) providing a semiconductor substrate including at least a region of a first conductivity type and having a surface;
    (b) forming in said region of first conductivity type a pair of spaced-apart source and drain regions of a second, opposite conductivity type, said pair of spaced-apart source and drain regions extending to said substrate surface and including a pair of opposed, facing edges with a space therebetween;
    (c) forming a blanket layer of an insulative material extending over said substrate;
    (d) exposing a portion of said substrate surface including said pair of facing edges of said pair of spaced-apart source and drain regions and said space therebetween;
    (e) forming a layer of a gate insulator precursor material on said exposed portion of said substrate surface by electrolytic deposition;
    (f) converting said layer of electrolytically-deposited gate insulator precursor material into a layer of a gate insulator material; and
    (g) forming an electrically conductive gate electrode material in contact with said layer of gate insulator material;
    wherein said steps are performed according to a first sequence (a), (c)–(d), (b), (e)–(g) or according to a second sequence (a)–(g).

2. The method as in claim 1, wherein:

step (e) comprises cathodically electroplating a metal layer.

3. The method as in claim 2, wherein:

step (e) comprises electroplating at least one layer of at least one refractory or lanthanum series transition metal selected from the group consisting of Zr, Hf, La, Lu, Eu, Pr, Nd, Gd, Dy, and alloys and mixtures thereof.

4. The method as in claim 1, wherein:

step (f) comprises converting said layer of gate insulator precursor material into a layer of a gate insulator material by reaction with at least oxygen.

5. The method as in claim 4, wherein:

step (f) comprises reacting said layer of gate insulator precursor material with oxygen to form a layer of a high-k gate insulator material comprising at least one refractory metal oxide or lanthanum series transition metal oxide.

6. The method as in claim 5, wherein:

step (f) comprises electrolytically anodizing said layer of gate insulator precursor material.

7. The method as in claim 5, wherein:

step (f) comprises forming at least one refractory metal oxide selected from the group consisting of zirconium oxide ($ZrO_2$) and hafnium oxide ($HfO_2$).

8. The method as in claim 4, wherein:

step (f) comprises reacting said layer of gate insulator precursor material with oxygen and said semiconductor substrate to form a layer of a high-k gate insulator material comprising at least one refractory metal silicate or lanthanum series transition metal silicate.

9. The method as in claim 8, wherein:

step (f) comprises thermally oxidizing said layer of gate insulator precursor material.

10. The method as in claim 8, wherein:

step (f) comprises forming at least one refractory metal silicate selected from the group consisting of zirconium silicate ($ZrSiO_4$) and hafnium silicate ($HfSiO_4$).

11. The method as in claim 1, wherein:

step (g) comprises forming a blanket layer of an electrically conductive material selected from the group consisting of metals, metal compounds, and semiconductors.

12. The method as in claim 11, further comprising the sequential steps of:

(h) planarizing said blanket layer of electrically conductive material, and (i) forming electrical contacts to each of said source and drain regions and said gate electrode.

13. The method as in claim 1, wherein:

step (a) comprises providing a semiconductor substrate comprising a material selected from the group consisting of silicon (Si), germanium (Ge), gallium arsenide (GaAs), silicon-germanium (SiGe), silicon-on-insulator (SOI), and epitaxial semiconductor layer-on-substrate materials.

14. The method as in claim 1, wherein said steps are performed according to said first sequence and:

step (a) comprises providing a silicon substrate; and step (b) comprises selectively forming a pair of spaced-apart metal silicide layers on respective spaced-apart portions of said substrate surface, introducing a dopant of said second, opposite conductivity type into said pair of spaced-apart metal silicide layers, and forming said pair of spaced-apart source and drain regions by out-diffusion of said dopant of second, opposite conductivity type from said pair of spaced-apart metal silicide layers into said substrate.

15. The method as in claim 14, wherein:

step (d) comprises forming an opening extending through said layer of insulative material to form said exposed portion of said substrate surface at the bottom of said opening.

16. The method as in claim 1, wherein said steps are performed according to said second sequence and:

step (b) comprises forming a temporary gate electrode structure on a portion of said substrate surface, and implanting dopant ions of said second, opposite conductivity type into said substrate surface to form said pair of spaced-apart source and drain regions, said temporary gate electrode forming at least part of an implantation mask during said implanting.

17. The method as in claim 16, wherein:

step (c) comprises forming said blanket layer of an insulative material so as to extend over said temporary gate electrode structure and said substrate, followed by planarization processing of said blanket layer to remove at least the portion thereof overlying said temporary gate electrode structure; and step (d) comprises removing said temporary gate electrode structure to form said exposed substrate surface portion.

* * * * *

UNITED STATES PATENT AND TRADEMARK OFFICE
CERTIFICATE OF CORRECTION

PATENT NO. : 6,300,203 B1
DATED : October 9, 2001
INVENTOR(S) : Matthew S. Buynoski et al.

It is certified that error appears in the above-identified patent and that said Letters Patent is hereby corrected as shown below:

<u>Title page,</u>
Item [75], Inventors, "change the spelling of the third inventor's name from "Qi Xang" to --Qi Xiang --.

Signed and Sealed this

Fifth Day of March, 2002

Attest:

Attesting Officer

JAMES E. ROGAN
*Director of the United States Patent and Trademark Office*